US007034578B2

(12) United States Patent
Bertram et al.

(10) Patent No.: US 7,034,578 B2
(45) Date of Patent: Apr. 25, 2006

(54) N-DOMINO OUTPUT LATCH WITH ACCELERATED EVALUATE PATH

(75) Inventors: Raymond A. Bertram, Austin, TX (US); James R. Lundberg, Austin, TX (US)

(73) Assignee: Via Technologies, Inc., Taipei (TW)

( * ) Notice: Subject to any disclaimer, the term of this patent is extended or adjusted under 35 U.S.C. 154(b) by 44 days.

(21) Appl. No.: 10/833,493

(22) Filed: Apr. 28, 2004

(65) Prior Publication Data

US 2004/0257115 A1 Dec. 23, 2004

Related U.S. Application Data

(60) Provisional application No. 60/472,146, filed on Apr. 28, 2003.

(51) Int. Cl.
*H03K 17/16* (2006.01)

(52) U.S. Cl. .......................... 326/121; 326/95; 326/98

(58) Field of Classification Search ................ 326/121, 326/17, 96, 95, 97, 113, 98; 716/1; 714/724; 327/202, 203, 208, 212, 215, 224, 225
See application file for complete search history.

(56) References Cited

U.S. PATENT DOCUMENTS

| 5,045,721 | A | * | 9/1991 | Yan .............................. 326/17 |
| 5,453,708 | A | | 9/1995 | Gupta et al. |
| 5,568,069 | A | * | 10/1996 | Chow .......................... 326/113 |
| 5,642,061 | A | * | 6/1997 | Gorny .......................... 326/97 |
| 5,926,038 | A | * | 7/1999 | Fouts et al. ..................... 326/95 |
| 6,058,403 | A | | 5/2000 | Vijayrao et al. |
| 6,060,909 | A | * | 5/2000 | Aipperspach et al. ......... 326/98 |
| 6,108,805 | A | * | 8/2000 | Rajsuman .................... 714/724 |
| 6,150,848 | A | * | 11/2000 | Fouts et al. ................... 326/96 |
| 6,201,415 | B1 | | 3/2001 | Manglore |
| 6,271,684 | B1 | * | 8/2001 | Rogenmoser ................ 326/95 |
| 6,320,420 | B1 | * | 11/2001 | Shibayama .................. 326/95 |
| 6,677,783 | B1 | * | 1/2004 | Samaan ....................... 326/96 |
| 6,732,336 | B1 | * | 5/2004 | Nystrom et al. ............... 716/1 |

FOREIGN PATENT DOCUMENTS

EP 1130780 A2 9/2001

* cited by examiner

*Primary Examiner*—Jean Bruner Jeanglaude
(74) *Attorney, Agent, or Firm*—Richard K. Huffman; James W. Huffman (57) ABSTRACT

An apparatus and method are provided for accelerating the evaluated output of an N-domino latch. The apparatus includes evaluation N-logic, latching logic, keeper logic, and acceleration logic. The evaluation N-logic is coupled to a first P-channel device at a pre-charged node, and is configured to evaluate a logic function based on at least one input data signal. The latching logic is coupled and responsive to a clock signal and the pre-charged node. The latching logic controls the state of a latch node based on the state of the pre-charged node during an-evaluation period between a first edge of said clock signal and a second edge of the clock signal. The latching logic otherwise presents a tri-state condition to the latch node. The keeper logic is coupled to the latch node. The keeper logic maintains the state of the latch node when the tri-state condition is presented, and provides a complementary state of the latch node at a complementary latch node. The acceleration logic is coupled and responsive to the pre-charged node and the complementary latch node, and is configured to control the state of an output node.

20 Claims, 5 Drawing Sheets

FIG. 1 (Prior Art)

FIG. 2 (Prior Art)
EVALUATE TIMING FOR N-DOMINO OUTPUT LATCH

N-DOMINO OUTPUT LATCH WITH ACCELERATED EVALUATE PATH

CROSS-REFERENCE TO RELATED APPLICATIONS

This application claims the benefit of U.S. Provisional Application No. 60/472146, filed on Apr. 28, 2003 which is herein incorporated by reference for all intents and purposes.

This application is related to the following co-pending U.S. Patent Application, which has a common assignee and at least one common inventor, and which is herein incorporated by reference in its entirety for all intents and purposes:

| Ser. No. | FILING DATE | TITLE |
| --- | --- | --- |
| (CNTR.2221) | HEREWITH | P-DOMINO OUTPUT LATCH WITH ACCELERATED EVALUATE PATH |

BACKGROUND OF THE INVENTION

1. Field of the Invention

The present invention relates to dynamic logic and domino logic functions, and more particularly to an N-domino output latch with an accelerated evaluate path.

2. Description of the Related Art

In recent years, domino circuits are being used more and more because of the speed advantages that they provide to an integrated circuit design. A typical domino output latch consists of three stages: 1) an-evaluation stage in which an-evaluation node is pre-charged to a specified state during one half of a clock cycle, and in which the state of the evaluation node is allowed to change during a second half of the clock cycle based upon the states of one or more inputs to function-evaluation logic within the evaluation stage; 2) a latching stage that latches a representation of the evaluated state of the evaluation node at a latch node; and 3) a buffering or inverting stage that conditions the state of the latch node for distribution to subsequent logic as an output signal. Domino circuits are fast because the signal upon which the output signal is based (i.e., the state of the evaluation node) is already pre-charged (i.e., pre-set) to one logic level and because the function-evaluation logic is comprised of only one type of logic devices, that is, either N-channel devices or P-channel devices. Speed benefits are gained in a domino circuit over conventional CMOS static logic because of reduced input capacitance, lower switching threshold levels, and the absence of parasitic diffusion capacitances on the outputs of the function-evaluation logic. Designers are finding domino circuits particularly suitable for very high speed and time critical applications such as those found in the microprocessor and digital signal processing areas.

Speed improvements over conventional CMOS logic notwithstanding, the present inventors have observed that the data-to-output time of present day domino latch is the result of three levels of device delay (also known as "gate delay"): one level of delay through the evaluation stage, one level of delay through the latching stage, and a final level of delay through the buffering stage. In the context of a present day integrated circuit that is manufactured under a 90 nanometer fabrication process, each level of gate delay contributes approximately 15 to 20 picoseconds (ps), thus resulting in an overall data-to-output time of approximately 45 to 60 ps, which is roughly one-third of a clock cycle in a present day integrated circuit designed for high-end applications.

Consequently, it is desirable to provide a domino latch that provides all of the above noted benefits, but which has a reduced data-to-output time over that which has heretofore been provided.

It is also advantageous to provide an N-domino latch with an accelerated evaluation path for applications that are time critical.

SUMMARY OF THE INVENTION

An N-domino latch according to one embodiment of the present invention includes evaluation N-logic, latching logic, keeper logic, and acceleration logic. The evaluation N-logic is coupled to a first P-channel device at a pre-charged node, and is configured to evaluate a logic function based on at least one input data signal. The latching logic is coupled and responsive to a clock signal and the pre-charged node. The latching logic controls the state of a latch node based on the state of the pre-charged node during an-evaluation period between a first edge of the clock signal and a second edge of the clock signal. The latching logic otherwise presents a tri-state condition to the latch node. The keeper logic is coupled to the latch node. The keeper logic maintains the state of the latch node when the tri-state condition is presented, and provides a complementary state of the latch node at a complementary latch node. The acceleration logic is coupled and responsive to the pre-charged node and the complementary latch node, where an output of the acceleration logic forms an output node providing an output signal, and where the acceleration logic is configured to control the state of the output node.

The present invention also contemplates an N-domino latch circuit, which includes N-logic, latching logic, and acceleration logic. The N-logic is coupled to a first P-channel device at a pre-charged node, and is configured to evaluate a logic function based on at least one input data signal. The first P-channel device has a gate for receiving the clock signal and a drain and source coupled between a source voltage and the pre-charged node. The latching logic is coupled and responsive to a clock signal and the pre-charged node. The latching logic controls the state of a latch node based on the state of the pre-charged node during an-evaluation period between a first edge of the clock signal and a second edge of the clock signal. The latching logic otherwise presents a tri-state condition to the latch node, where keeper logic maintains the state of the latch node when the tri-state condition is presented, and where the keeper logic provides a complementary state of the latch node at a complementary latch node. The acceleration logic is coupled and responsive to the pre-charged node and the complementary latch node, where an output of the acceleration logic forms an output node providing an output signal, and where the acceleration logic is configured to control the state of the output node.

Another embodiment of the present invention comprehends a method of providing an accelerated output in an N-domino latch circuit. The method includes pre-setting a pre-charged node while a clock signal is in a first logic state; coupling the pre-charged node to acceleration logic that forms an output node providing the accelerated output; dynamically evaluating an N-logic function to control the logic state of the first node when the clock signal transitions to a second logic state; latching a logic state of a latch node based on the logic state of the pre-charged node determined during an-evaluation period beginning when the clock signal transitions to the second logic state and ending with the next corresponding transition of the clock signal to the first logic state; complementing the logic state of the latch node to provide a complementary latch node; and accelerating presentation of the accelerated output by responding to the state of the pre-charged node during the evaluation period.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing improved domino latches for logic circuits in which speed is a critical factor. They have therefore developed an N-domino latch with an accelerated evaluation path that provides a latched output for simple to complex logic evaluation functions and which is significantly faster than existing configurations, as will be further described below with respect to FIGS. 1–5. When employed in a pipeline or other high-end architecture that relies heavily on the evaluation of logic functions in multiple successive stages, an N-domino latch according to an embodiment of the present invention enables overall device operating speed to be significantly increased.

Figure 1:
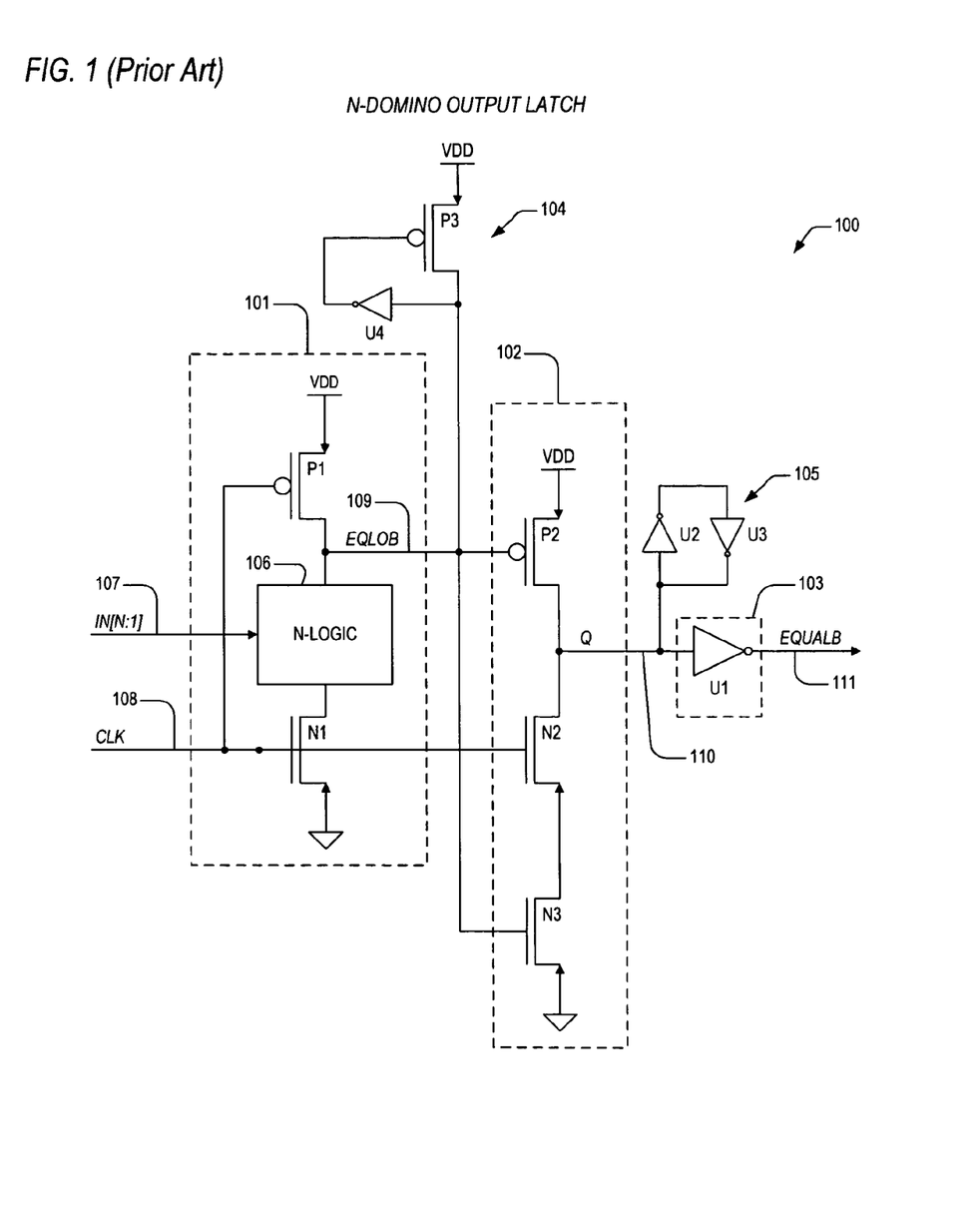
FIG. 1 is a schematic diagram of an exemplary N-domino output latch for illustrating N-domino circuit characteristics.

Turning to FIG. 1, a schematic diagram is presented illustrating an exemplary N-domino output latch 100. The N-domino output latch 100 includes an-evaluation stage 101 consisting of stacked P-channel and N-channel devices P1, N1 and N-evaluation logic 106 coupled between devices P1 and N1. The source of P1 is coupled to a voltage source VDD and its drain is coupled to a pre-charged node 109 providing a signal EQLOB. The N-evaluation logic 106 is coupled to the pre-charged node 109 and to the drain of N1. The source of N1 is coupled to ground. A clock signal CLK is provided via a clock node 108 to the gates of P1 and N1. One or more input data signals IN[N:1] are provided via one or more input nodes 107 to the N-evaluation logic 106. The pre-charged node 109 is coupled to a half keeper circuit 104 consisting of an inverter U4 whose output is coupled to the gate of a P-channel device P3. The source of P3 is coupled to VDD and the drain of P3 is coupled to the input, of U4 and to the pre-charged node 109.

The configuration of the N-evaluation logic 106 is based upon the particular logic function that is to be evaluated, but it is noted that, consistent with the design principles of domino circuits, the N-evaluation logic 106 comprises one or more N-channel devices. For example, a simple N-domino latch 100 is provided by configuring a single N-channel device (not shown) having a drain connected to the pre-charged node 109 and a source coupled to the drain of N1, and having a gate coupled to a single input signal IN1. Alternatively, an N-domino 2-input OR latch is configured by providing two N-channel devices (not shown) in parallel having gates driven by two input signals IN1, IN2. An N-domino 2-input AND latch is configured by stacking two N-channel devices (not shown) and driving their gates by two input signals IN1, IN2. And so on.

The evaluation stage 101 is coupled to a latching stage 102 comprising stacked P-channel and N-channel devices P2, N2, N3. The source of P2 is coupled to source voltage VDD and the drain of P2 is coupled to the drain of N2 forming a latch node 110 providing a latch signal Q. The source of N2 is coupled to the drain of N3 and the source of N3 is coupled to ground. The gate of N2 is coupled to the clock node 108 and the gates of P2 and N3 are coupled to the pre-charged node 109.

The latching stage 102 is coupled to a buffering stage 103 comprising inverter U1. The input of U1 is coupled to the latch node 110 and to a weak keeper circuit 105 comprising inverters U2 and U3. The input of U2 is coupled to the latch node 110 and to the output of U3. The output of U2 is coupled to the input of U3. The output of the buffering stage 103 forms an output node 111 providing an output signal EQUALB. Although an inverter U1 is employed within the buffering stage 103 of the exemplary N-domino output latch, one skilled in the art will appreciate that a non-inverting buffer may be employed in place of U1 to enable desired output state for distribution to subsequent logic.

One skilled in the art will appreciate that the typical application of the N-domino output latch 100 of FIG. 1 is employment as a final domino stage in a series of domino stages whose outputs all evaluate during the same cycle of signal CLK. In addition, one skilled will appreciate that immediately previous domino stages having output signals coupled to node 107 may be configured with only an-evaluation stage similar to evaluation stage 101, thus precluding the need for device N1, which is known in the art as a "footer." Consequently, a "footless" configuration of the N-domino output latch 100 would not include N1.

Figure 2:
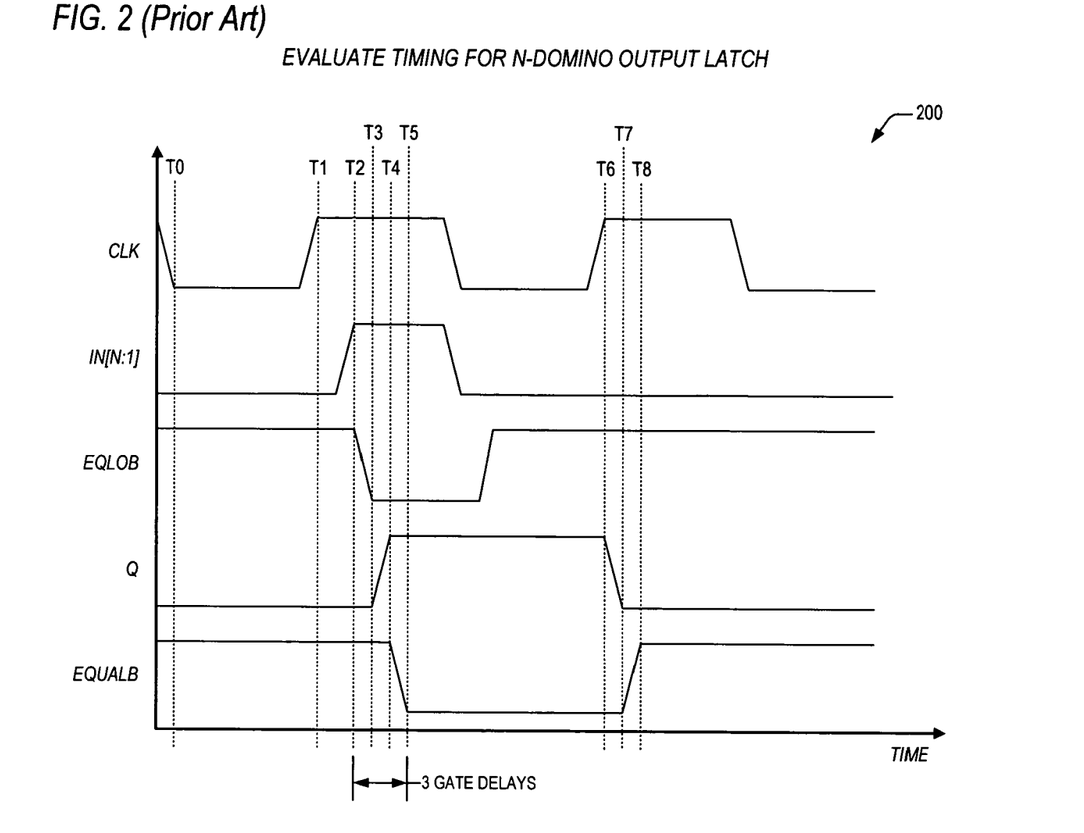
FIG. 2 is a timing diagram illustrating operation of the N-domino output latch of FIG. 1.

Now referring to FIG. 2, a timing diagram 200 is presented depicting operation of the N-domino output latch 100 of FIG. 1 in which the CLK, IN[N:1], EQLOB, Q, and EQUALB signals are plotted versus time. At a time T0 when the CLK signal is low, N1 is turned off and P1 is turned on, which pre-charges the EQLOB signal to a logic high level in preparation for evaluation of the IN[N:1] signal upon the rising edge of CLK. During the half cycle when the CLK signal is low, device N3 is on and devices P2 and N2 are off, thus presenting a tri-state condition to the latch node 110. Accordingly, when the latch node 110 is tri-stated, signal Q is maintained in its former state by the weak keeper circuit 105, which is depicted in the timing diagram 200 as a logic low level. Consequently, signal EQUALB at the output node 111 is at a logic high level. Signal IN[N:1] is typically low as well during the half cycle when clock is low, as is shown at time T0, because, as is discussed above, domino circuits 100 such as that shown in FIG. 1 are typically configured in a cascaded arrangement with a preceding domino circuit's output signal connected to a subsequent circuit's input signal. Hence at time T1, because the IN[N:1] signal is at a logic low level, the N-devices within the N-evaluation logic 106 are turned off. For purposes of teaching the present invention, the one or more input signals IN[N:1] are treated as a single signal IN1 whose assertion to a logic high level causes the logic function implemented by the N-evaluation logic 106 to be evaluated as true.

At subsequent time T1, the CLK signal is asserted to a logic high level, which turns N1 and N2 on and P1 off. Since the IN[N:1] signal is low at time T1, the N-channel devices within the N-evaluation logic 106 are off so that the EQLOB signal is not driven by the N-evaluation logic 106. During this time, however, the half keeper circuit 104 maintains the high logic level of the EQLOB signal. If, during the half cycle while the CLK signal is high any of the one or more input signals IN[N:1] are driven to a logic level that causes the N-evaluation logic to evaluate the logic function as true, as shown at subsequent time T2, one or more of the N-channel devices within the N-evaluation logic 106 turn on while N1 is on, which overpowers the half keeper circuit 104 so that the EQLOB signal is discharged to a low logic level through the N-evaluation logic 106 and N1, as is shown at time T3. One stage of gate delay is presented through the N-evaluation logic 106.

When EQLOB discharges (or "evaluates"), N3 turns off and P2 turns on, driving latch signal Q to a logic high state, as is shown at time T4. An additional stage of gate delay is added through the latching stage 102 when the state of signal EQLOB propagates through to signal Q.

Inverter U1 responds to signal Q by driving the output signal EQUALB to a logic low state, as is shown at time T5. A third stage of gate delay is added through the buffering stage 103 when the state of the latch signal Q propagates through the inverter U1 to the output signal EQUALB.

Because domino circuits are typically cascaded, the input signal IN[N:1] may be asserted at any time subsequent to signal CLK going high and prior to signal CLK going back low. The period of time between CLK going high and CLK going back low is known in the art as the "evaluation period."

The CLK signal subsequently goes low and the input signal IN[N:1] is also driven low. The EQLOB signal is pre-charged high once again by P1, and the latch node 110 is tri-stated. The weak keeper circuit 105 maintains the state of signal Q, and the complementary state of Q is provided by the inverter U1 to signal EQUALB.

At subsequent time T6, the CLK signal is once again asserted high while IN[N:1] is low, so that N1 is turned on, yet the N-evaluation logic 106 does not evaluate. The EQLOB signal, thus, is not discharged and this provides a discharge path to ground for signal Q through devices N2 and N3. As signal Q goes low at time T7, signal EQUALB is driven high at time T8. One skilled in the art will appreciate, however, that driving a correct combination of IN[N:1] (such that the logic function implemented by the N logic 106 evaluates true) at any point during the half cycle of CLK following time T6 would cause signal EQLOB to discharge and would cause signal Q to be driven high and signal EQUALB to be driven low.

Domino circuits, exemplified by the N-domino output latch 100 of FIG. 1, are faster than other circuit configurations that are designed to accomplish the same logic evaluation function, including static implementations, because the output of these circuits is already preset (e.g., pre-charged) to one logic state, and because of reduced input capacitance to the evaluation logic 106, lower switching threshold levels, and the absence of parasitic diffusion capacitances on the outputs of the evaluation logic 106. Data setup time is virtually eliminated because clocking mechanisms (e.g., P1, N1) are integrated in the evaluation stage 101 with the evaluation logic 106. One of ordinary skill in the art will appreciate that more complex evaluation logic (e.g. a multiple-input mux) can be configured as the N-evaluation logic 106 in the N-domino output latch 100 without adversely impacting its speed or its associated power constraints.

Although domino output latches are fast, the present inventors have recognized the need to provide such capabilities in a manner such that data-to-output time for an N-domino output latch 100 is significantly reduced over that which has heretofore been provided. As is noted in FIG. 2, the data-to-output time of a present day N-domino output latch 100 is the result of three levels of gate delay, one level through the evaluation stage 101, one level through the latching stage 102, and a third level through the buffering stage 103. Consequently, the present inventors have developed an N-domino output latch with an accelerated evaluation path which reduces the data-to-output time by approximately one-third over that of a conventional N-domino output latch 100. The present invention will now be discussed with reference to FIGS. 3–5.

Figure 3:
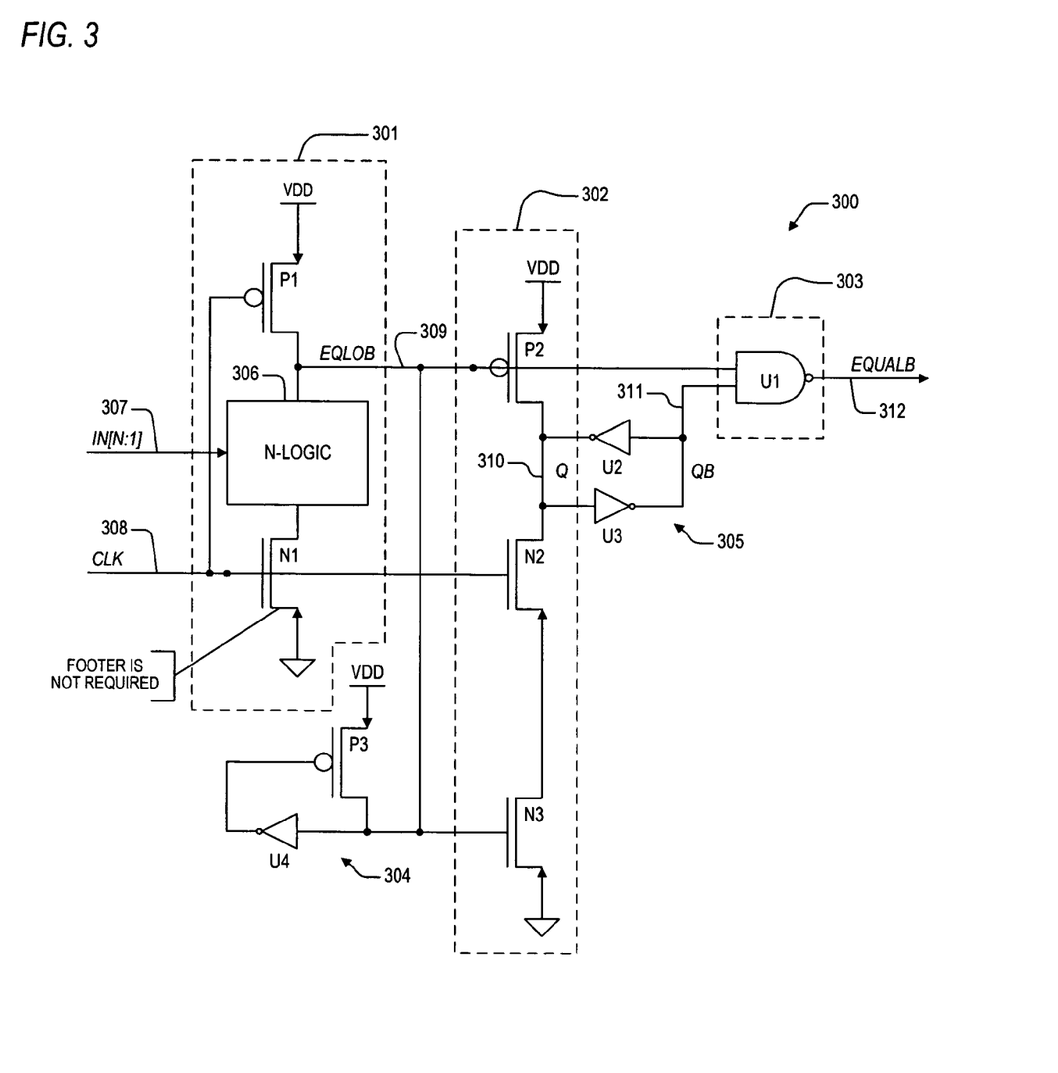
FIG. 3 is a schematic diagram of an N-domino output latch with an accelerated evaluate path according to an exemplary embodiment of the present invention.

Referring to FIG. 3, a schematic diagram is presented illustrating an exemplary N-domino output latch 300 according to the present invention. Like the conventional N-domino output latch 100 discussed with reference to FIG. 1, the N-domino output latch 300 according to the present invention has an-evaluation stage 301 consisting of stacked P-channel and N-channel devices P1, N1 and N-evaluation logic 306 coupled between devices P1 and N1. The source of P1 is coupled to a voltage source VDD and its drain is coupled to a pre-charged node 309 providing a signal EQLOB. The N-evaluation logic 306 is coupled to the pre-charged node 309 and to the drain of N1. The source of N1 is coupled to ground. A clock signal CLK is provided via a clock node 308 to the gates of P1 and N1. One or more input data signals IN[N:1] are provided via one or more input nodes 307 to the N-evaluation logic 306. The pre-charged node 309 is coupled to a half keeper circuit 304 consisting of an inverter U4 whose output is coupled to the gate of a P-channel device P3. The source of P3 is coupled to VDD and the drain of P3 is coupled to the input of U4 and to the pre-charged node 309.

In a substantially similar manner as discussed with reference to the N-domino latch 100 of FIG. 1, the configuration of the N-evaluation logic 306 is based upon the particular logic function that is to be evaluated yet, consistent with the design principles of domino circuits, the N-evaluation logic 306 comprises one or more N-channel devices. For example, a simple N-domino latch 300 is provided by configuring a single N-channel device (not shown) having a drain connected to the pre-charged node 309 and a source coupled to the drain of P1, and having a gate coupled to a single input signal IN1. Alternatively, an N-domino 2-input OR latch is configured by providing two N-channel devices (not shown) in parallel having gates driven by two input signals IN1, IN2. Such a device will be discussed below with reference to FIG. 4. An N-domino 2-input AND latch is configured by stacking two N-channel devices (not shown) and driving their gates by two input signals IN1, IN2. And so on.

The evaluation stage 301 is coupled to a latching stage 302 comprising stacked P-channel and N-channel devices P2, N2, N3. The source of P2 is coupled to source voltage VDD and the drain of P2 is coupled to the drain of N2 forming a latch node 310 providing a latch signal Q. The source of N2 is coupled to the drain of N3 and the source of N3 is coupled to ground. The gate of N2 is coupled to the clock node 308 and the gates of P2 and N3 are coupled to the pre-charged node 309.

The latch node 310 is coupled to a weak keeper circuit 305 comprising inverters U2 and U3. The input of U3 is coupled to the latch node 310 and to the output of U2. The output of U3 is coupled to the input of U2 forming a complementary latch node 311 that provides a complementary latch signal QB.

In contrast to a conventional N-domino output latch 300, both the evaluation stage 301 and the latching stage 302 according to the present invention are coupled to acceleration logic 303. In one embodiment, the acceleration logic 303 comprises a logical NAND gate U1, although other embodiments are contemplated. A first input of U1 is coupled to the complementary latch node 311 and a second input of U1 is coupled to the pre-charged node 309. The output of the acceleration logic 303 forms an output node 312 providing an output signal EQUALB. Although a 2-input NAND gate U1 is employed within the acceleration logic 303 of the exemplary N-domino output latch 300 according to the present invention, the present inventors note that alternative embodiments are contemplated which utilize alternative logic devices (e.g., NOR, exclusive-OR, etc.) or having more than two inputs where qualifying signals are provided to the additional inputs.

A typical application of the N-domino output latch 300 according to the present invention is employment as a final domino stage in a series of domino stages whose outputs all evaluate during the same cycle of signal CLK. In addition, like the N-domino latch 100 of FIG. 1, one skilled will appreciate that immediately previous domino stages having output signals coupled to node 307 may be configured with only an-evaluation stage similar to evaluation stage 301, thus precluding the need for footer device N1. Accordingly, the present invention comprehends footless embodiments as well which do not include footer N1.

An accelerated evaluation path is provided in the N-domino latch 300 according to the present invention by coupling the pre-charged node 309 directly to the acceleration logic 303, thus bypassing the latching stage 302, which therefore eliminates the gate delay that is otherwise contributed by the latching stage 302 when the N-evaluation logic 306 evaluates true, pulling the pre-charge node 309 to a logic low level.

Figure 4:
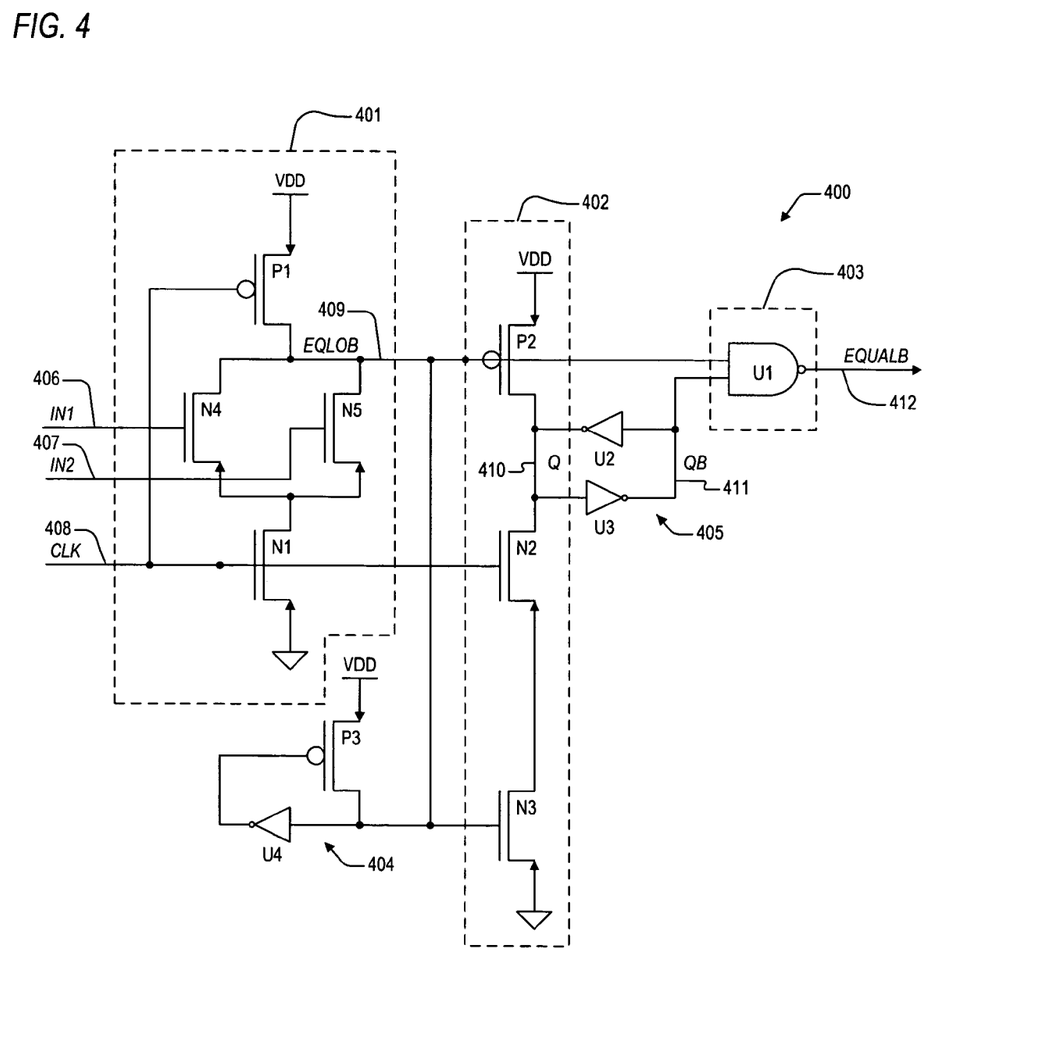
FIG. 4 is a schematic diagram of an N-domino OR latch with an accelerated evaluate path according to another embodiment of the present invention.

Now referring to FIG. 4, a schematic diagram of an N-domino OR latch 400 with an accelerated evaluate path is presented according to another embodiment of the present invention. Elements of the N-domino OR latch 400 are identical to like elements of the N-domino output latch 300 of FIG. 3, where the hundreds digit is replaced with a "4." In addition, the N-evaluation logic 306 of the N-domino output latch 300 of FIG. 3 is specifically embodied as two parallel N-channel devices N4, N5, which provide for evaluation of a 2-input OR function during the evaluation period. A first input node 406 is coupled to the gate of N4 providing a first input signal IN1 and a second input node 407 is coupled to the gate of N5 providing a second input signal IN2. If either of the two input signals IN1, IN2 are asserted during the evaluation period, then the implemented OR function is true and the pre-charge node 409 discharges through an associated enabled N-channel device N4, N5 and device N1. The present inventors note that more than two N-channel devices may be configured in parallel to configure a multiple-input OR output latch without disadvantageously affecting data-to-output time. Operation of the N-domino 2-input OR latch 400 will now be discussed with reference to FIG. 5.

Figure 5:
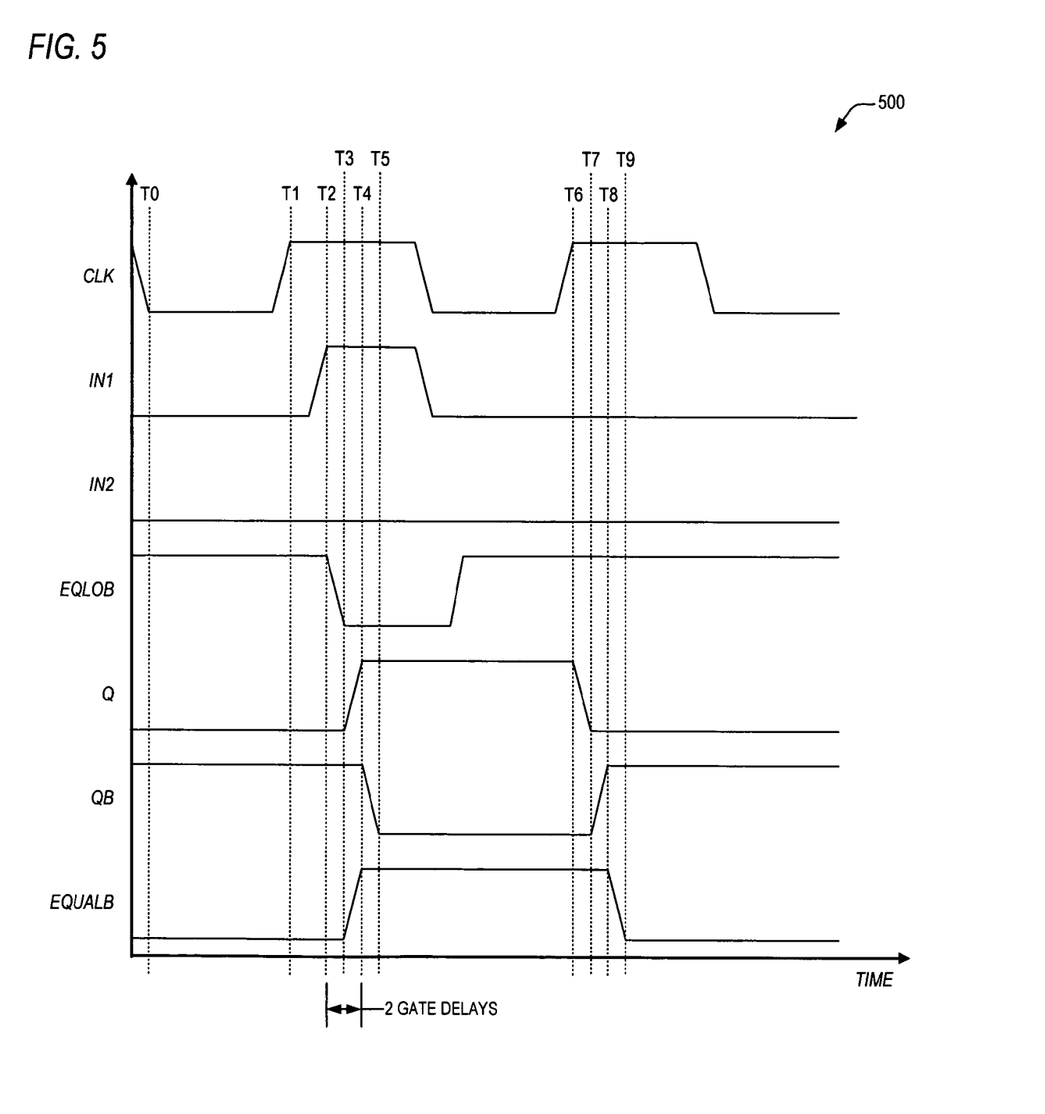
FIG. 5 is a timing diagram illustrating operation of the N-domino OR latch of FIG. 4.

Turning to FIG. 5, a timing diagram 500 is presented showing operation of the 2-input N-domino OR latch 400 of FIG. 4 in which the CLK, IN1, IN2, EQLOB, Q, QB, and EQUALB signals are plotted versus time. At a time T0 when the CLK signal is low, N1 is turned off and P1 is turned on, which pre-charges the EQLOB signal to a logic high level in preparation for evaluation of the IN1, IN2 signals upon the rising edge of CLK. During the half cycle when the CLK signal is low, device N3 is on and devices P2 and N2 are off, thus presenting a tri-state condition to the latch node 410. Accordingly, when the latch node 410 is tri-stated, signal Q is maintained in its former state by the weak keeper circuit 405, which is depicted in the timing diagram 500 as a logic low level and signal QB, which is the complementary state of signal Q is maintained as well by keeper circuit 405 at a logic high level. Consequently, signal EQUALB at the output node 412 is at a logic low level since both EQLOB and QB are high. Input signals IN1, IN2 are typically low as well during the half cycle when CLK is low, as is shown at time T0. Hence, at time T1, because the input signals IN1, IN2 are at a logic low level, devices N4 and N5 are off.

At subsequent time T1, on a first edge of the CLK signal, the CLK signal is asserted to a logic high level, which turns N1 and N2 on and P1 off. Since the both IN1 and N2 signals are low at time T1 and thus N4 and N5 are off, the EQLOB signal is not driven low by either N4 or N5. During this time, the half keeper circuit 404 maintains the high logic level of the EQLOB signal. If, during the half cycle while the CLK signal is high, either IN1 or IN2 (or both IN1 and IN2) is asserted high, the implemented OR function evaluates by turning on the N-device N4, N5 associated with the asserted input signal IN1, IN2. At time T2, signal IN1 is asserted and IN2 remains at a logic low level, thus leaving N5 off and enabling a discharge path for EQLOB through N4 and N1 to ground, which overpowers the half keeper circuit 404 so that the EQLOB signal is discharged to a low logic level, as is shown at time T3. One stage of gate delay is presented through the evaluate stage 401.

When EQLOB discharges (or "evaluates"), N3 turns off and P2 turns on, driving latch signal Q to a logic high state, as is shown at time T4. An additional stage of gate delay is would be otherwise added through the latching stage 402 when the state of signal EQLOB propagates through to signal Q, as is shown at time T4. But in contrast to a conventional N-domino output latch 100, because of the accelerated evaluate path provided by the present invention, which circumvents the latching stage 402 during the evaluate period, signal EQLOB directly drives the second input to the accelerate logic 403, thus driving output signal EQUALB to a logic high level at time T4 as well. Hence, only two levels of gate delay are experienced during evaluation according to the present invention, thus reducing data-to-output time by one-third over that of a conventional N-domino output latch 100.

At time T5, complementary latch signal QB is driven to a logic low level, which ensures that the output signal EQUALB will be maintained high when EQLOB pre-charges.

As was alluded to with reference to FIG. 2, because domino circuits are typically cascaded, the input signals IN1, IN2 may be asserted at any time during the evaluation period that is subsequent to signal CLK going high and prior to signal CLK going back low.

On a second edge of the CLK signal, the CLK signal goes low and the first input signal IN1 is also driven low. The EQLOB signal is pre-charged high once again by P1, and the latch node 410 is tri-stated. The weak keeper circuit 405 maintains the state of signals Q and QB, and hence the output signal EQUALB is maintained because EQLOB is at a logic high level, thus allowing QB to control the state of the output signal EQUALB.

At subsequent time T6, the CLK signal is once again asserted high while both IN1 and IN2 are low, so that N1 is turned on, yet both N4 and N5 are off. The EQLOB signal, thus, is not discharged and this condition provides a discharge path to ground for signal Q through devices N2 and N3. As signal Q goes low at time T7, signal QB is driven high at time T8. And because both EQLOB and QB are high, EQUALB is driven to a logic low state at time T9. It is noted that driving either IN1 or IN2 (or both signals) high at any point during the half cycle of CLK following time T6 would cause signal EQLOB to discharge and would cause signal EQUALB to be driven high.

It is noted that one objective of the present invention is to reduce the data-to-output time of an N-domino output latch under evaluate conditions. This is because, as noted above, an N-domino output latch is typically the last in a chain of domino circuits whose input signal may change state such that the N-domino output latch evaluates very late during an evaluation half-cycle of CLK, that is, between a first edge of the half-cycle and a second edge of the same half-cycle. Consequently, the N-domino output latch according to the present invention eliminates the gate delay associated with a latching stage within a conventional N-domino latch under evaluate conditions, thus enabling devices to run much faster.

Although the present invention has been described in considerable detail with reference to certain preferred versions thereof, other versions and variations are possible and contemplated. For example, the N-evaluation logic can be as simple or as complex as desired and may be implemented in any suitable manner as understood by those of ordinary skill in the art. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An N-domino latch, comprising:
   evaluation N-logic, coupled to a first P-channel device at a pre-charged node, configured to evaluate a logic function based on at least one input data signal;
   latching logic, coupled and responsive to a clock signal and said pre-charged node, configured to control the state of a latch node based on the state of said pre-charged node during an-evaluation period between a first edge of said clock signal and a second edge of said clock signal, and configured to otherwise present a tri-state condition to said latch node;
   keeper logic, coupled to said latch node, configured to maintain the state of said latch node when said tri-state condition is presented, and configured to provide a complementary state of said latch node at a complementary latch node; and
   acceleration logic, coupled and responsive to said pre-charged node and said complementary latch node, wherein an output of said acceleration logic forms an output node providing an output signal, and wherein said acceleration logic is configured to control the state of said output node.

2. The N-domino latch as recited in claim 1, wherein said first P-channel device comprises:
   a gate for receiving said clock signal and a drain and source coupled between a source voltage and said pre-charged node.

3. The N-domino latch as recited in claim 1, wherein said evaluation N-logic comprises a complex logic circuit.

4. The N-domino latch as recited in claim 3, wherein said evaluation N-logic pulls said pre-charged node down to a logical low level if said logic function evaluates true.

5. The N-domino latch as recited in claim 1, wherein said latching logic comprises:
   a second P-channel device having a first gate coupled to said pre-charged node and having a first source and a first drain coupled between a source voltage and said latch node;
   a first N-channel device having a second gate for receiving said clock signal and having a second source and a second drain coupled between said latch node and pre-charged node; and
   a second N-channel device having a third gate coupled to said pre-charged node and having a third source and a third drain coupled between said pre-charged node and ground.

6. The N-domino latch as recited in claim 1, wherein said keeper logic comprises:
   a first inverter, having a first input coupled to said latch node and having first output coupled to said complementary latch node; and
   a second inverter, having a second input coupled to said complementary latch node and having second output coupled to said latch node.

7. The N-domino latch as recited in claim 1, wherein said acceleration logic comprises a logical NAND device.

8. The N-domino latch as recited in claim 1, further comprising:
   a first N-channel device, having a first gate for receiving said clock signal and having a first source and first drain coupled between said evaluation N-logic and ground.

9. The N-domino latch as recited in claim 8, wherein said evaluation N-logic comprises:
   a second N-channel device, having a second gate for receiving a first input signal and having a second source and second drain coupled between said pre-charged node and said first N-channel device; and
   a third N-channel device, having a third gate for receiving a second input signal and having a third source and third drain coupled between said pre-charged node and said first N-channel device.

10. An N-domino latch circuit, comprising:
    N-logic, coupled to a first P-channel device at a pre-charged node, configured to evaluate a logic function based on at least one input data signal, said first P-channel device comprising:

a gate for receiving said clock signal and a drain and source coupled between a source voltage and said pre-charged node;

latching logic, coupled and responsive to a clock signal and said pre-charged node, configured to control the state of a latch node based on the state of said pre-charged node during an-evaluation period between a first edge of said clock signal and a second edge of said clock signal, and configured to otherwise present a tri-state condition to said latch node, wherein keeper logic maintains the state of said latch node when said tri-state condition is presented, and wherein said keeper logic provides a complementary state of said latch node at a complementary latch node; and acceleration logic, coupled and responsive to said pre-charged node and said complementary latch node, wherein an output of said acceleration logic forms an output providing an output signal, and wherein said acceleration logic is configured to control the state of said output node.

11. The N-domino latch circuit as recited in claim 10, wherein said evaluation N-logic comprises a complex logic circuit.

12. The N-domino latch circuit as recited in claim 11, wherein said evaluation N-logic pulls said pre-charged node down to a logical low level if said logic function evaluates true.

13. The N-domino latch circuit as recited in claim 10, wherein said latching logic comprises:
a second P-channel device having a first gate coupled to said pre-charged node and having a first source and a first drain coupled between a source voltage and said latch node;
a first N-channel device having a second gate for receiving said clock signal and having a second source and a second drain coupled between said latch node and said pre-charged node; and
a second N-channel device having a third gate coupled to said pre-charged node and having a third source and a third drain coupled between said pre-charged node and ground.

14. The N-domino latch circuit as recited in claim 10, wherein said keeper logic comprises:
a first inverter, having a first input coupled to said latch node and having first output coupled to said complementary latch node; and
a second inverter, having a second input coupled to said complementary latch node and having second output coupled to said latch node.

15. The N-domino latch circuit as recited in claim 10, wherein said acceleration logic comprises a logical NAND device.

16. The N-domino latch circuit as recited in claim 10, further comprising:
a first N-channel device, having a first gate for receiving said clock signal and having a first source and first drain coupled between said evaluation N-logic and ground.

17. The N-domino latch circuit as recited in claim 16, wherein said evaluation N-logic comprises:
a second N-channel device, having a second gate for receiving a first input signal and having a second source and second drain coupled between said pre-charged node and said first N-channel device; and
a third N-channel device, having a third gate for receiving a second input signal and having a third source and third drain coupled between said pre-charged node and said first N-channel device.

18. A method of providing an accelerated output in an N-domino latch circuit comprising:
pre-setting a pre-charged node while a clock signal is in a first logic state;
coupling the pre-charged node to acceleration logic that forms an output node providing the accelerated output;
dynamically evaluating an N-logic function to control the logic state of the first node when the clock signal transitions to a second logic state;
latching a logic state of a latch node based on the logic state of the pre-charged node determined during an-evaluation period beginning when the clock signal transitions to the second logic state and ending with the next corresponding transition of the clock signal to the first logic state;
complementing the logic state of the latch node to provide a complementary latch node; and
accelerating presentation of the accelerated output by responding to the state of the pre-charged node during the evaluation period.

19. The method as recited in claim 18, wherein said pre-setting comprises pre-charging the pre-charged node to a high logic state.

20. The method of claim 18, further comprising:
maintaining the logic state of the latch node by presenting a tri-state condition to the latch node and coupling a keeper circuit to the latch node.

* * * * *